(12) United States Patent
Xu et al.

(10) Patent No.: US 7,667,141 B2
(45) Date of Patent: Feb. 23, 2010

(54) FLEXIBLE PRINTED CIRCUIT LAYOUT AND METHOD THEREOF

(75) Inventors: Ying-Fang Xu, Jiang-Su (CN); Ning-Hua Li, Jiang-Su (CN); Chin-Mei Huang, Taichung (TW); Tsui-Chuan Wang, Dali (TW)

(73) Assignee: Wintek Corporation, Taichung (TW)

( * ) Notice: Subject to any disclaimer, the term of this patent is extended or adjusted under 35 U.S.C. 154(b) by 29 days.

(21) Appl. No.: 12/180,087

(22) Filed: Jul. 25, 2008

(65) Prior Publication Data

US 2010/0018754 A1    Jan. 28, 2010

(51) Int. Cl.
*H05K 1/00*  (2006.01)
(52) U.S. Cl. .................. 174/254; 174/262; 174/263; 174/264; 174/265; 174/266; 29/846; 29/847
(58) Field of Classification Search .................. 174/254, 174/262–266; 29/846, 847, 850
See application file for complete search history.

(56) References Cited

U.S. PATENT DOCUMENTS 5,326,990 A * 7/1994 Mita et al. .................. 257/672
5,428,889 A * 7/1995 Mita et al. .................... 29/827
5,892,661 A * 4/1999 Stafford et al. .............. 361/737
6,111,306 A * 8/2000 Kawahara et al. ........... 257/666

* cited by examiner

*Primary Examiner*—Jinhee J Lee
*Assistant Examiner*—Abiy Getachew
(74) *Attorney, Agent, or Firm*—Morris, Manning & Martin LLP; Tim Tingkang Xia

(57) ABSTRACT

The present invention discloses a flexible printed circuit (FPC) layout and a method thereof. The flexible printed circuit (FPC) layout method comprises steps of: providing a circuit board body; disposing at least an electroplating point on the circuit board body; disposing a plurality of solder pads on the circuit board body, the plurality of solder pads comprising at least a first solder pad and at least a second solder pad being connected respectively to the electroplating point through an internal wire, the first solder pad being further connected to an electroplating zone on the circuit board body through an external wire; performing an electroplating process from the electroplating zone through the external wire so that the external wire, the first solder pad connected to the external wire, the electroplating point connected through the internal wire to the first solder pad, and the second solder pad connected through the internal wire to the electroplating point are electroplated and electrically connected; and providing at least a via hole at the electroplating point on the circuit board body to form an open circuit between the first solder pad and the second solder pad. By using the disclosed method, the flexible printed circuit layout of the present invention can be formed.

3 Claims, 3 Drawing Sheets

FLEXIBLE PRINTED CIRCUIT LAYOUT AND METHOD THEREOF

BACKGROUND OF THE INVENTION

1. Field of the Invention

The present invention generally relates to a flexible printed circuit (FPC) layout and a method thereof and, more particularly, to a flexible printed circuit layout and a FPC layout method capable of fast detecting the integrity of the solder pads and the electroplating lines on a flexible printed circuit.

2. Description of the Prior Art

The flexible printed circuit (FPC) is mostly manufactured by electroplating because electroplating allows more flexibility. However, in a flexible printed circuit layout, the solder pads for elements have to be connected to an electroplating zone in the border region on the flexible printed circuit so that the manufacturer can use the pins that are clamped to perform electroplating. In such a FPC layout, the integrity of the electroplating lines can be automatically checked after electroplating. For copper exposure pads that cannot be connected to the border region, additional lead wires are required to perform electroplating. However, the currently available software cannot detect the integrity of the electroplating lines formed by electroplating with additional lead wires. Instead, human labor is required for integrity check. Therefore, it takes human labor and time and still cannot avoid omissions of unchecked electroplating lines.

SUMMARY OF THE INVENTION

It is one object of the present invention to provide a flexible printed circuit layout and a method thereof capable of fast detecting the integrity of the solder pads and the electroplating lines in the border region of a flexible printed circuit.

In order to achieve the foregoing object, the present invention provides a flexible printed circuit (FPC) layout and a method thereof. The flexible printed circuit (FPC) layout method comprises steps of: providing a circuit board body; disposing at least an electroplating point on the circuit board body; disposing a plurality of solder pads on the circuit board body, the plurality of solder pads comprising at least a first solder pad and at least a second solder pad being connected respectively to the electroplating point through an internal wire, the first solder pad being further connected to an electroplating zone on the circuit board body through an external wire; performing an electroplating process from the electroplating zone through the external wire so that the external wire, the first solder pad connected to the external wire, the electroplating point connected through the internal wire to the first solder pad, and the second solder pad connected through the internal wire to the electroplating point are electroplated and electrically connected; and providing at least a via hole at the electroplating point on the circuit board body to form an open circuit between the first solder pad and the second solder pad. By using the disclosed method, the flexible printed circuit layout of the present invention can be formed.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention can be exemplified by the preferred embodiments as described hereinafter.

Figure 1:
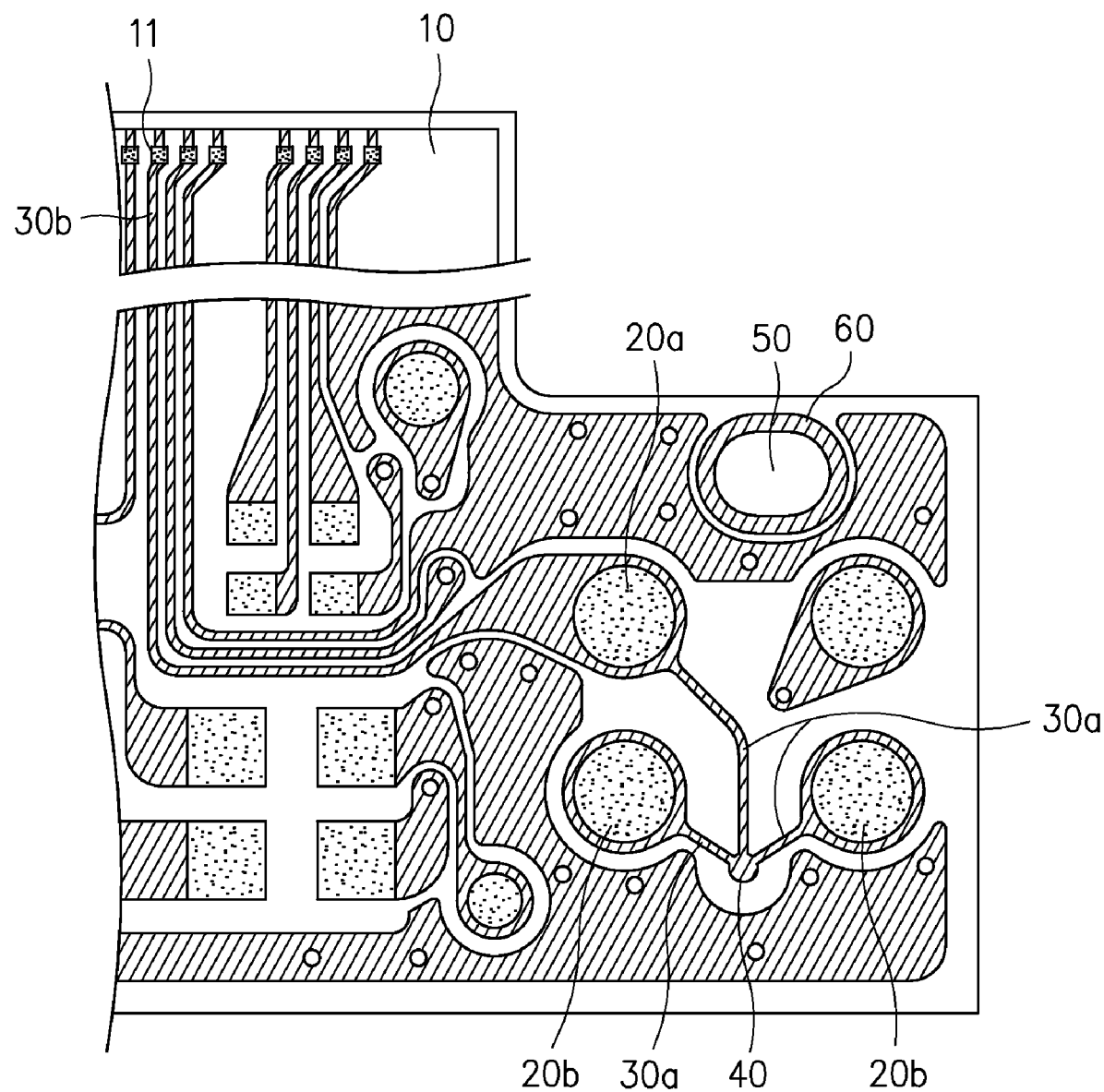
FIG. 1 is a top view of a flexible printed circuit layout comprising an electroplating point without a via hole according to a first embodiment of the present invention.

Please refer to FIG. 1, which is a top view of a flexible printed circuit comprising an electroplating point without a via hole according to a first embodiment of the present invention. An electroplating point 40 and a plurality of solder pads are disposed on a circuit board body 10. The plurality of solder pads comprise a first solder pad 20a and two second solder pads 20b being connected respectively to the electroplating point 40 through an internal wire 30a. The first solder pad 20a is further connected to an electroplating zone 11 on the circuit board body 10 through an external wire 30b. Generally, the electroplating zone 11 is disposed in the border region on the circuit board body 10 (as shown in FIG. 1).

Accordingly, in the aforesaid layout, the integrity of the electroplating lines on the circuit board body 10 can be automatically checked. More particularly, the integrity of the external wire 30b connected to the first solder pad 20a can be automatically checked from the electroplating zone 11 in the border region on the circuit board body 10. Moreover, the integrity of the internal wire 30a connected to the first solder pad 20a and the second solder pads 20b can be automatically checked from the electroplating zone 11. The integrity of the electroplating lines on the circuit board body 10 can be checked by an examination software application used by flexible printed circuit manufacturers. The layout and checking process thereof will be described hereinafter.

At the beginning of the layout process of the circuit board body 10 in FIG. 1, the aforesaid examination software application is used to label a first color on the first solder pad 20a capable of being connected to the electroplating zone 11 in the border region on the circuit board body 10 and a second color or any other color different from the first color on the second solder pads 20b incapable of being connected to the electroplating zone 11 in the border region on the circuit board body 10. The first solder pad 20a labeled with the first color is connected to a first network and the second solder pads 20b labeled with the second color are connected to a second network. Such information thereof is stored in the examination software application.

Then the layout process is performed. On the circuit board body 10 with a layout, as shown in FIG. 1, there are the first solder pad 20a, the second solder pads 20b, the internal wires 30a, and the external wires 30b. Then the examination software application selects one of the networks. Normally, the first color is shown on the first solder pad 20a and the external wires 30b if the first network is selected; otherwise the second color is shown on the second solder pads 20b and the internal wire 30a if the second network is selected. Therefore, those elements unlabeled with any color are not connected to the electroplating zone 11 in the border region on the circuit board body 10. In other words, such an examination software application can be used to automatically and fast detect the layout and correct any mistake in real-time to avoid defects.

When the layout is completed, the FPC manufacturer uses the pins that are clamped to perform an electroplating process from the electroplating zone 11 so that the external wires, the first solder pad 20a connected to the external wire 30b, the electroplating point 40 connected through the internal wire 30a to the first solder pad 20a, and the second solder pads 20b connected through the internal wires 30a to the electroplating point 40 are electroplated and electrically connected.

It is noted that the number and the position of the disposed electroplating point 40 are not restricted. Instead, they are designed according to the size and the shape of the circuit board body 10, the number, the size and the position of the first solder pad 20a and the second solder pad 20b. The shape of the electroplating point 40 is exemplified by, but not limited to circular, rectangular or of any other shape. As shown in FIG. 1, the electroplating point 40 is circular and is connected to the first solder pad 20a and the two second solder pads 20b.

Figure 2:
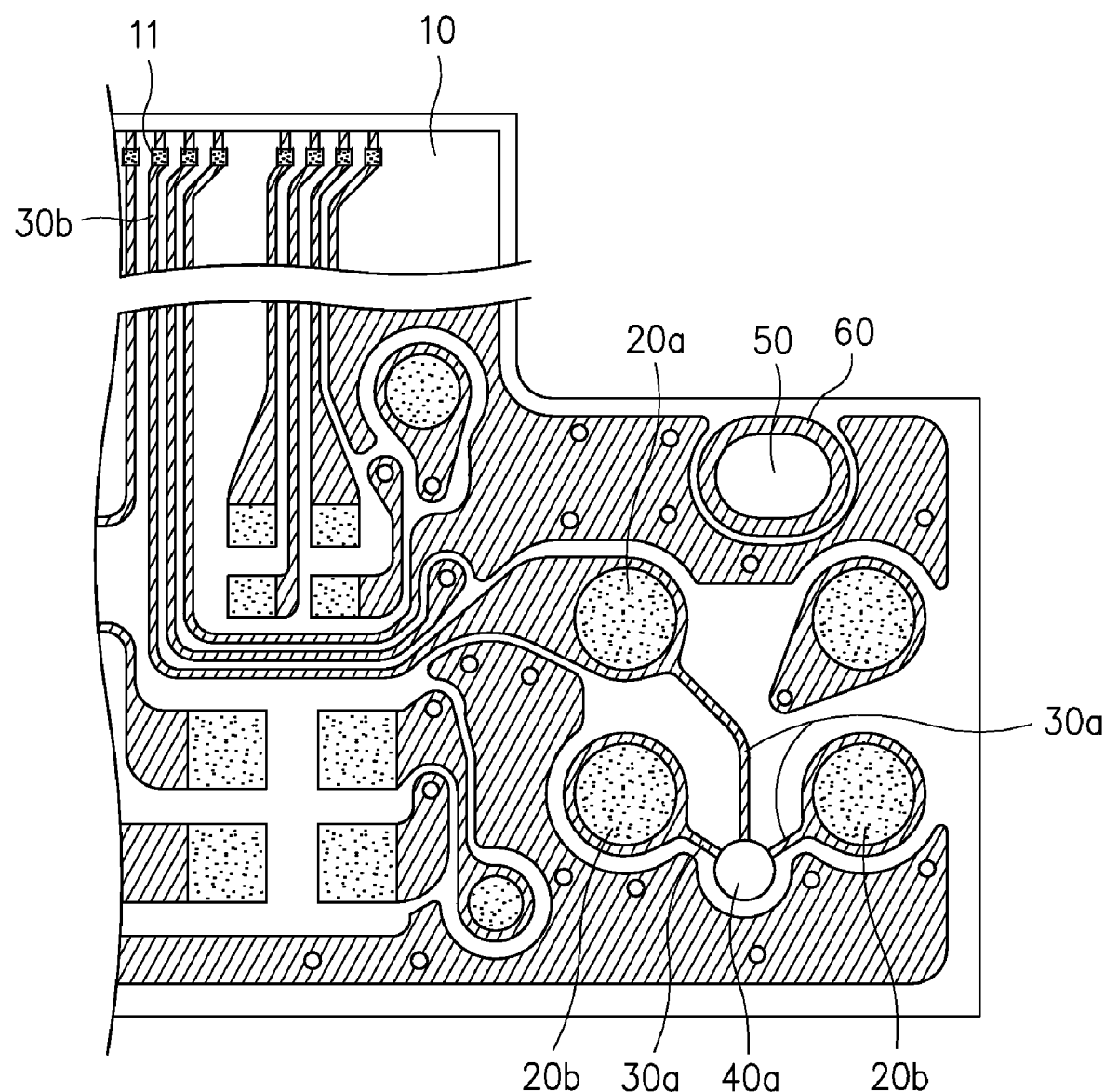
FIG. 2 is a top view of a flexible printed circuit layout comprising an electroplating point with a via hole according to a second embodiment of the present invention.
Figure 3:
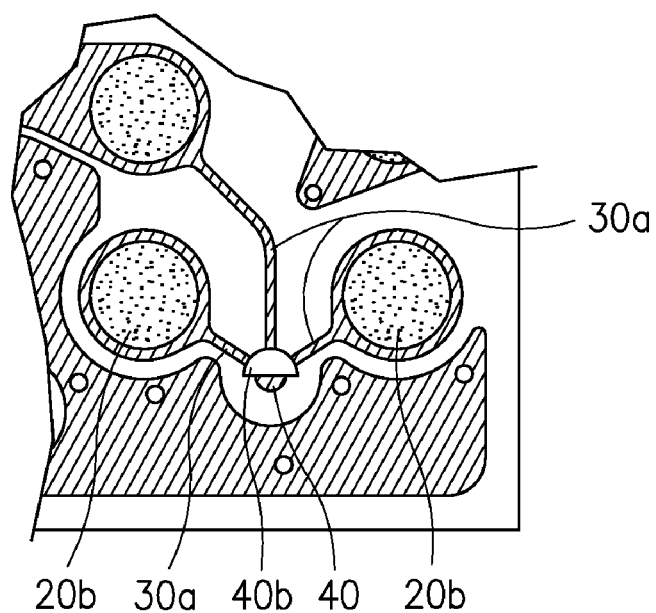
FIG. 3 is a top view of a flexible printed circuit layout comprising an electroplating point with a via hole according to a third embodiment of the present invention.
Figure 4:
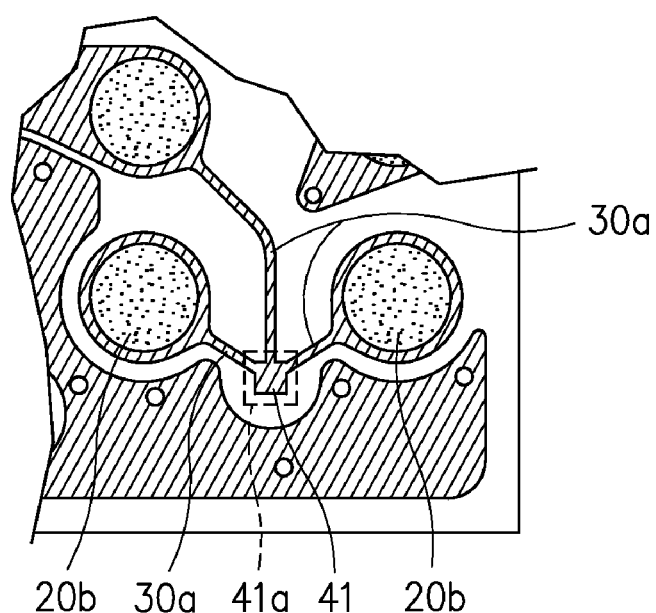
FIG. 4 is a top view of a flexible printed circuit layout comprising an electroplating point with a via hole according to a fourth embodiment of the present invention.

After the electroplating process, since the first solder pad 20a and the second solder pads 20b are electrically connected to the electroplating point 40, an open circuit between the first solder pad 20a and the second solder pads 20b has to be formed to complete a flexible printed circuit layout of the present invention. As shown in FIG. 2, a via hole 40a is disposed at the electroplating point 40 on the circuit board body 10 to form an open circuit between the first solder pad 20a and the two second solder pads 20b. Similarly, the shape of the via hole 40a is exemplified by, but not limited to circular, rectangular or of any other shape as long as there can be an open circuit between the first solder pad 20a and the two second solder pads 20b. As shown in FIG. 3, the via hole 40b is half-circular so that there is an open circuit between the first solder pad 20a and the two second solder pads 20b even though the electroplating point 40 may not be completely removed. In FIG. 4, the electroplating point 41 and the via hole 41a (indicated by the dotted line) are both rectangular. As a matter of fact, the electroplating point and the via hole are designed unrestrictedly according to practical uses.

It is noted that generally the circuit board body 10 comprises a tooling hole 50, as shown in FIG. 2, so as to position the circuit board body 10 inside a casing of an electronic device. However, to prevent the tooling hole 50 from being damaged, there is a protection layer 60 formed around the tooling hole 50. On the contrary, in present invention, there is no such protection layer around the via hole 40a to avoid short circuit. In other words, the tooling hole 60 and the via hole 40a can be easily distinguished according to the presence of the protection layer.

Accordingly, the embodiments disclose a flexible printed circuit layout and a FPC layout method capable of fast detecting the integrity of the solder pads and the electroplating lines on a flexible printed circuit using an examination software application.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A flexible printed circuit (FPC) layout method, comprising steps of:
    providing a circuit board body;
    disposing at least one electroplating point on the circuit board body;
    disposing a plurality of solder pads on the circuit board body, the plurality of solder pads comprising at least one first solder pad and at least one second solder pad being connected respectively to the electroplating point through an internal wire, the first solder pad being further connected to an electroplating zone on the circuit board body through an external wire;
    performing an electroplating process from the electroplating zone through the external wire so that the external wire, the first solder pad connected to the external wire, the electroplating point connected through the internal wire to the first solder pad, and the second solder pad connected through the internal wire to the electroplating point are electroplated and electrically connected; and
    providing a via hole at the electroplating point on the circuit board body to form an open circuit between the first solder pad and the second solder pad.

2. The flexible printed circuit (FPC) layout method as recited in claim 1, wherein the electroplating point is circular, rectangular or of any other shape.

3. The flexible printed circuit (FPC) layout method as recited in claim 1, wherein the via hole is circular, rectangular or of any other shape.

* * * * *